United States Patent [19]

Das

[11] Patent Number: 5,294,814
[45] Date of Patent: Mar. 15, 1994

[54] VERTICAL DIAMOND FIELD EFFECT TRANSISTOR

[75] Inventor: Kalyankumar Das, Raleigh, N.C.

[73] Assignee: Kobe Steel USA, Research Triangle Park, N.C.

[21] Appl. No.: 896,538

[22] Filed: Jun. 9, 1992

[51] Int. Cl.⁵ .................. H01L 31/0312; H01L 29/80; H01L 29/76; H01L 29/12

[52] U.S. Cl. .................... 257/77; 257/263; 257/266; 257/368; 257/613

[58] Field of Search ............. 257/77, 256, 263, 264, 257/266, 268, 270, 368, 613; 437/100

[56] References Cited

U.S. PATENT DOCUMENTS

| | | | |
|---|---|---|---|
| 3,603,848 | 9/1971 | Sato | 317/235 |
| 4,643,161 | 2/1987 | Kim | 125/30 R |
| 4,863,529 | 9/1989 | Imai et al. | 437/100 |
| 4,903,089 | 2/1990 | Hollis et al. | 357/22 |
| 5,002,899 | 3/1991 | Geis et al. | 437/173 |
| 5,006,914 | 4/1991 | Beetz, Jr. | 357/61 |
| 5,034,784 | 7/1991 | Yamazaki | 257/77 |
| 5,036,373 | 7/1991 | Yamazaki | 257/77 |
| 5,087,322 | 2/1992 | Lillienfeld et al. | 437/20 |
| 5,132,749 | 7/1992 | Nishibayashi et al. | 257/77 |

FOREIGN PATENT DOCUMENTS

0343963 11/1989 European Pat. Off. .......... 357/23.4

OTHER PUBLICATIONS

U.S. Patent Application Serial No. 07/646,848 entitled Semiconducting Polycrystalline Diamond Electronic Devices Employing an Insulating Diamond Layer by Dreifus et al., filed Jan. 28, 1991.

High-Temperature Point-Contact Transistors and Schottky Diodes Formed on Synthetic Boron-Doped Diamond, M. W. Geis, IEEE Electron Device Letters, vol. EDL-8, No. 8, Aug. 1987, pp. 341-343.

Ohmic Contact to Semiconducting Diamond, K. L. Moazed, IEEE Electron Device Letters, vol. 9, No. 7, Jul. 1988, pp. 350-351.

Effective p-type Doping of Diamond by Boron Ion Implanation, G. Braunstein et al., J. Appl. Phys. 54(4), Apr. 1983, pp. 2106-2108.

A Review of the Electrical Characteristics of Metal Contacts on Diamond, K. Das et al., pp. 1-8.

Characterization of Boron-Doped Diamond Epitaxial Films and Applications for High-Voltage Schottky Diodes and MESFET's, H. Shiomi et al., New Diamond Science and Technology, MRS Int. Conf. Proc. 1991, pp. 975-980.

Effect of Thin Interfacial $SiO_2$ Films on Metal Contacts to B Doped Diamond Films, V. Venkatesan et al., Journal of Electrochem. Soc., May 1992, pp. 1-19.

A Thermally Activated Solid State Reaction Process for Fabricating Ohmic Contacts to Semiconducting Diamond, K. L. Moazed et al., J. Appl. Phys. 68(5), 1990, pp. 2246-2254.

(List continued on next page.)

Primary Examiner—Rolf Hille
Assistant Examiner—Steven Loke
Attorney, Agent, or Firm—Bell, Seltzer, Park & Gibson

[57] ABSTRACT

A vertical diamond field effect transistor includes a nondiamond substrate, preferably a heavily doped silicon substrate, having a diamond layer on one face thereof, a source contact on the diamond layer, a gate contact on the diamond layer adjacent the source contact, and a drain contact on the back face of the substrate. The diamond layer is preferably a single layer of large polycrystalline diamond grains, having a heavily doped region adjacent the silicon substrate. The gate and source contacts may extend across many polycrystalline diamond grains in the single layer of polycrystalline diamond grains. Alternatively, the source and gate contacts may be narrower than the average grain size of the polycrystalline diamond grains. Interdigitated source and gate fingers, narrower than the average polycrystalline diamond grain size, may also be provided. The single layer of polycrystalline grains may be formed on the silicon substrate. High performance vertical diamond field effect transistor devices are thereby provided.

43 Claims, 8 Drawing Sheets

OTHER PUBLICATIONS

Summary Abstract: Device Applications of Diamonds, M. W. Geis et al., J. Vac. Sci. Technol.A6(3), May/Jun. 1988, pp. 1953–1954.

Diamond Transistor Performance and Fabrication, M. W. Geis, Proceedings of the IEEE, vol. 79, No. 5, May 1991, pp. 669–676.

Diamond MESFET Using Ultrashallow RTP Boron Doping, W. Tsai et al., IEEE Electron Device Letters, vol. 12, No. 4, Apr. 1991, pp. 157–159.

Polycrystalline Diamond Field-Effect Transistors, A. J. Tessmer et al., Diamond and Related Materials Jan., 1992, Elsevier Science Publishers, pp. 89–92.

IGFET Fabrication on Homoepitaxial Diamond Using In Situ Boron and Lithium Doping, G. G. Fountain et al., pp. 1–8.

Fabrication of an Insulated Gate Diamond FET for High Temperature Applications, C. A. Hewett et al., pp. 168–173.

High-Temperaturte Thin-Film Diamond Field-Effect Transistor Fabricated Using a Selective Growth Method, G. S. Gildenblat et al., IEEE Electron Device Letters, vol. 12, No. 2, Feb. 1992, pp. 37–39.

A High Voltage-Gain GaAs Vertical Field-Effect Transistor with an InGaAs/Planar-Doped Barrier Launcher, Y. H. Won et al., IEEE Electron Device Letters vol. 11, No. 9, Sep. 1990, pp. 376–378.

A Vertical Integration of GaAs/GaAlAs LED and Vertical FET with Embedded Schottky Electrodes, C. Hong et al., Japanese Journal of Applied Physics, vol. 29, No. 12, Dec. 1990, pp. L2427–L2429.

Determination of Electron Energy Distribution in a GaAs Vertical Field-Effect Transistor with Hot-Electron Injection, K. Yamasaki et al., Appl. Phys. Lett. 54(3), Jan. 1989, pp. 274–276.

Vertical Integration of GaAs/AlGaAs Laser Diode and Vertical JFET, H. Yoo et al., Japanese Journal of Applied Physics, vol. 27, No. 3, Mar. 1988, pp. L431–L433.

A Numerical Analysis of a Short Vertical $n^+$-$n^-$-$n^+$ GaAs MESFET, C. Lyden et al. IEEE Electron Device Letters, vol. EDL-5, No. 2, Feb. 1984, pp. 43–44.

Vertical Field-Effect Transistors in III–V Semiconductors, Z. Rav-Noy et al., Appl. Phys. Lett. 45(3) Aug. 1984, pp. 258–260.

Vertical FET's in GaAs, Z. Rav-Noy et al., IEEE Electron Device Letters, vol. EDL-5, No. 7, Jul. 1984, pp. 228–230.

Semiconductors for High-Voltage, Vertical Channel Field Effect Transistors, B. J. Baliga, J. Appl. Phys. 53(3), Mar. 1982, pp. 1759–1764.

Ion-Implanted FET for Power Applications, D. P. Lecrosnier et al., Transactions on Electron Devices, vol. ED-21, No. 1, Jan. 1974, pp. 113–118.

Complementary Vertical Bipolar Transistor Process Using High-Energy Ion Implantation, F. W. Ragay et al., Electronic Letters, vol. 27, No. 23, Nov. 1991, pp. 2141–2143.

A High-Power High-Gain VD-MOSFET Operating at 900 $MH_z$, O. Ishikawa et al., IEEE Transactions on Electron Devices, vol. ED-34, No. 5, May 1987, pp. 1157–1162.

Vertical-Type Amorphous-Silicon Field-Effect Transistors with Small Parasitic Elements, Y. Uchida et al., Japanese Journal of Applied Physics, vol. 25, No. 7, Sep. 1986, pp. L798–L800.

Proposed Vertical-Type Amorphous-Silicon Field-Effect Transistors, Y. Uchida et al., IEEE Electron Device Letters, vol. EDL-5, No. 4, Apr. 1984, pp. 105–107.

A Vertical FET with Self-Aligned Ion-Implanted Source and Gate Regions, O. Ozawa et al., IEEE Transactions on Electron Devices, vol. ED-25, No. 1, Jan. 1978, pp. 56–57

VERTICAL DIAMOND FIELD EFFECT TRANSISTOR

FIELD OF THE INVENTION

This invention relates to field effect transistors, and more particularly to vertical field effect transistors.

BACKGROUND OF THE INVENTION

There are two general schemes for integrating a Field Effect Transistor (FET) into a semiconductor substrate: horizontal and vertical integration. In horizontal integration, carrier flow in the field effect transistor, from source to drain, occurs in the direction parallel to the plane of the substrate, i.e. parallel to the top and bottom faces of the substrate. In contrast, in a vertical FET, current flow from the source to the drain occurs transverse to the plane of the substrate, i.e. transverse to the top and bottom faces of the substrate.

Horizontal FETs are widely used because of the relative ease of isolation among devices, and because of the ease of application to large scale integration. Large scale integration is more easily implemented with horizontal FETs because the drain, source and gate contacts are all located on one face of the substrate. Vertical FETs, on the other hand, generally have a superior power-delay product and a higher power handling capacity compared with their lateral counterparts. Moreover, for high power devices, the provision of a source contact on one substrate face and a drain contact on the opposite substrate face maximizes power handling ability.

In view of these advantages, much development effort has been focused on vertical field effect transistors in silicon and gallium arsenide. Silicon based vertical field effect transistors are described in publications entitled *A Vertical FET With Self-Aligned Ion-Implanted Source and Gate Regions* by Ozawa et al., IEEE Transactions on Electron Devices, Vol. ED-25, No. 1, January 1978, pp. 56–57; *Proposed Vertical-Type Amorphous-Silicon Field-Effect Transistors* by Uchida, IEEE Electron Device Letters, Vol. EDL-5, No. 4, April 1984, pp. 105–107; *Vertical-Type Amorphous-Silicon Field-Effect Transistors with Small Parasitic Elements* by Uchida et al., Japanese Journal of Applied Physics, Vol. 25, No. 9, September 1986, pp. L798–L800; *A High-Power High-Gain VD-MOSFET Operating at 900 MHz* by Ishikawa et al., IEEE Transaction on Electron Devices, Vol. ED-34, No. 5, May 1987, pp. 1157–1162; and *Complementary Vertical Bipolar Transistor Process Using High-Energy Ion Implantation* by Ragay et al., Electronics Letters, Vol. 27, No. 23, November 1991, pp. 2141–2143.

Gallium arsenide based vertical field effect transistors are described in U.S. Pat. No. 4,903,089 to Hollis et al. entitled *Vertical Transistor Device Fabricated With Semiconductor Regrowth*, and in publications entitled *Ion-Implanted FET for Power Applications* by Lecrosnier et al., Transactions on Electron Devices, Vol. ED-21, No. 1, January 1974, pp. 113–118; *Semiconductors for High-Voltage, Vertical Channel Field Effect Transistors* by B. J. Baliga, J. Appl. Phys. 53(3), March 1982, pp. 1759–1764; *Vertical FET's in GaAs* by Rav-Noy et al., IEEE Electron Device Letters, Vol. EDL-5, No. 7, July 1984, pp. 228–230; *Vertical Field-Effect Transistors in III-V Semiconductors* by Rav-Noy et al., Appl. Phys. Let. 45(3), August 1984, pp. 258–260; *A Numerical Analysis of a Short Vertical n+-n--n+ GaAs MESFET* by Lyden et al., IEEE Electron Device Letters, Vol. EDL-5, No. 2, February 1984, pp. 43–44; *Vertical Integration of GaAs/AlGaAs Laser Diode and Vertical JFET* by Yoo et al., Japanese Journal of Applied Physics, Vol. 27, No. 3, March 1988, pp. L431–L433; *Determination of Electron Energy Distribution in a GaAs Vertical Field-Effect Transistor With Hot-Electron Injection* by Yamasaki et al., Appl. Phys. Lett. 54(3), January 1989, pp. 274–276; *A Vertical Integration of GaAs/GaAlAs LED and Vertical FET With Embedded Schottky Electrodes* by Hong et al., Japanese Journal of Applied Physics, Vol. 29, No. 12, December 1990, pp. L2427–L2429; and *A High Voltage-Gain GaAs Vertical Field-Effect Transistor With an InGaAs/GaAs Planar-Doped Barrier Launcher* by Won et al, IEEE Electron Device Letters, Vol. 11, No. 9, September 1990, pp. 376–378.

Diamond is a preferred material for semiconductor devices because it has semiconductor properties that are better than silicon, germanium or gallium arsenide. Diamond provides a higher energy bandgap, a higher breakdown voltage and a higher saturation velocity than these traditional semiconductor materials.

These properties of diamond yield a substantial increase in projected cutoff frequency and maximum operating voltage compared to devices fabricated using silicon, germanium or gallium arsenide. Silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. Since FETs are fundamental building blocks of modern integrated circuits, there is interest in the design and fabrication of diamond FETs.

The design and fabrication of horizontal diamond FETs have been widely reported in the art. See for example, U.S. Pat. No. 3,603,848 entitled *Complementary Field-Effect-Type Semiconductor Device* by Sato et al. and publications entitled *High-Temperature Thin-Film Diamond Field-Effect Transistor Fabricated Using a Selective Growth Method* by Gildenblat et al., IEEE Electron Device Letters, Vol. 12, No. 2, February 1991, pp. 37–39; *Fabrication of an Insulated Gate Diamond FET for High Temperature Applications* by Hewett et al., presented at the International High Temperature Electronics Conference in Albuquerque, NM, June 1991, pp. 168–173; *IGFET Fabrication of Homoepitaxial Diamond Using in Situ Boron and Lithium Doping* by Fountain et al., presented at the Electrochemical Society meeting held in Washington, DC in May, 1991; and *Diamond*

*MESFET Using Ultrashallow RTP Boron Doping* by Tsai et al., IEEE Electron Device Letters, Vol. 12, No. 4, April 1991, pp. 157-159. See also the publication by A. J. Tessmer, K. Das and D. L. Dreifus entitled *Polycrystalline Diamond Field-Effect Transistors*, Diamond and Related Materials I (1992), pp. 89-92, Elsevier Science Publishers B.V., Amsterdam, Holland.

Development of vertical diamond FETs has not been as widely reported or as successful. A proposed diamond vertical FET structure is described in a publication entitled *Diamond Transistor Performance and Fabrication* by Geis, Proceedings of the IEEE, Vol. 79, No. 5, May 1991, pp. 669-676. Described at FIGS. 2 and 3 is a possible vertical field effect transistor formed on a conducting diamond substrate and having a bottom drain contact thereon, and a homoepitaxial boron doped diamond layer including gate and source regions. The publication notes, at page 670, that "at present, the technical problems in manufacturing a highly conductive diamond substrate have not been solved . . . ". See also an earlier publication by Geis et al. entitled *Device Applications of Diamonds*, Journal of Vacuum Society Technology, Vol. A6, No. 3, May-June 1988, pp. 1953-1954.

In conclusion, although vertical diamond field effect transistors are highly desirable, the art has not heretofore suggested a viable vertical diamond field effect transistor structure, or manufacturing process therefor.

SUMMARY OF THE INVENTION

It is therefore an object of the invention to provide an improved diamond field effect transistor.

It is another object of the invention to provide an improved vertical diamond field effect transistor.

It is yet another object of the invention to provide an improved method of making a vertical diamond field effect transistor.

These and other objects are provided, according to the invention, by a vertical field effect transistor including a nondiamond substrate, preferably a heavily doped monocrystalline silicon substrate of predetermined conductivity type, or a crystalline conductive substrate which is lattice matched to diamond. The transistor also includes a diamond layer on the nondiamond substrate, with the diamond layer being a monocrystalline diamond layer or a single layer of large polycrystalline diamond grains preferably about 15-20 μm in grain size. Preferably a thin, heavily doped region of the predetermined conductivity type is included in the diamond layer adjacent the silicon substrate, and the remainder of the diamond layer is lightly doped or undoped. The heavily doped diamond region and the heavily doped silicon substrate reduce the drain resistance of the device.

A source contact is provided on the diamond layer, with the source contact preferably comprising a refractory metal layer (such as titanium of molybdenum) on the diamond layer and a nonrefractory metal layer (such as gold) on the refractory metal layer to protect the refractory metal from oxidation. A heavily doped region of the predetermined conductivity type may be included in the diamond layer under the refractory metal layer. When annealed, at least a portion of the refractory metal layer is converted to refractory metal carbide to form a low resistance ohmic contact to the diamond layer. The nondiamond substrate also includes a drain contact, preferably opposite the diamond layer.

A gate is also provided on the diamond layer adjacent the source contact. The gate may be a ring which laterally surrounds the source contact or may be an elongated gate on one or more sides of an elongated source contact. Alternatively, the source and gate contacts may be interdigitated fingers on the diamond layer. Other shapes may also be used. The gate contact may be a metal layer formed directly on the diamond layer. Alternatively, the gate contact may be insulated from the diamond layer using a thick insulating layer (about 100Å-1000Å and preferably about 600Å) to form a metal oxide semiconductor (MOS) gate contact, or a thin layer (about 20Å or less) to form a rectifying (MIS) gate contact.

The nondiamond substrate includes a drain contact so that the source and drain contacts define therebetween a vertical channel for the vertical field effect transistor. In one embodiment, the gate and source contacts are relatively large, compared to the size of the polycrystalline diamond grains in the single layer of polycrystalline diamond grains, such that the source and gate contacts extend across many polycrystalline diamond grains. Alternatively, the source and gate contacts may be small, i.e. narrower than the average grain size of the polycrystalline diamond grain. Many of these small sources and gates may be formed on the single layer of polycrystalline diamond grains. The multiple sources and gates may operate independently, or they may be connected in parallel to form a power device. In yet another embodiment, a single large source and gate formed as a series of interdigitated fingers, may be provided on the single layer of polycrystalline diamond grains with one or more of the fingers being narrower than the average grain size.

The vertical FET of the present invention may be fabricated by forming a highly doped diamond layer on a nondiamond (e.g. silicon) substrate. A single layer of polycrystalline diamond grains is preferably formed. The single layer of polycrystalline diamond grains may be formed in one deposition step, with high doping being provided initially and low or no doping provided thereafter. Alternatively, the single polycrystalline diamond layer may be formed in a series of deposition and chemical/mechanical polishing steps to minimize stresses in the polycrystalline grains. Average grain size of about 15-20 μm may be formed without requiring intermediate polishing of the layer during formation. Larger or smaller grain sizes may also be formed.

After the polycrystalline diamond layer is formed, the source may be formed by a selective area implantation of boron followed by an anneal. After surface cleaning, a refractory metal film is deposited and annealed to form the source ohmic contact. The gate electrode is patterned and a gate contact is formed either directly or after formation of an insulating layer such as silicon dioxide. A metal drain contact is formed on the back of the silicon substrate. Alternatively, the silicon substrate may be removed, and the drain contact may be formed on the single layer of polycrystalline diamond grains, opposite the source contact, so that a vertical field effect transistor may be formed in a freestanding single layer of polycrystalline diamond grains.

Since the diamond layer is preferably a single polycrystalline grain layer thick, enhanced operation is provided because most carriers need not cross a grain boundary in moving vertically from the source to drain. When multiple small source and gate contacts are provided, many of the channels will be fully contained within a single polycrystalline diamond grain. The remaining channels will cross only one grain boundary. Monocrystalline-like properties will be obtained even though polycrystalline diamond is used.

DESCRIPTION OF A PREFERRED EMBODIMENT

Figure 1:
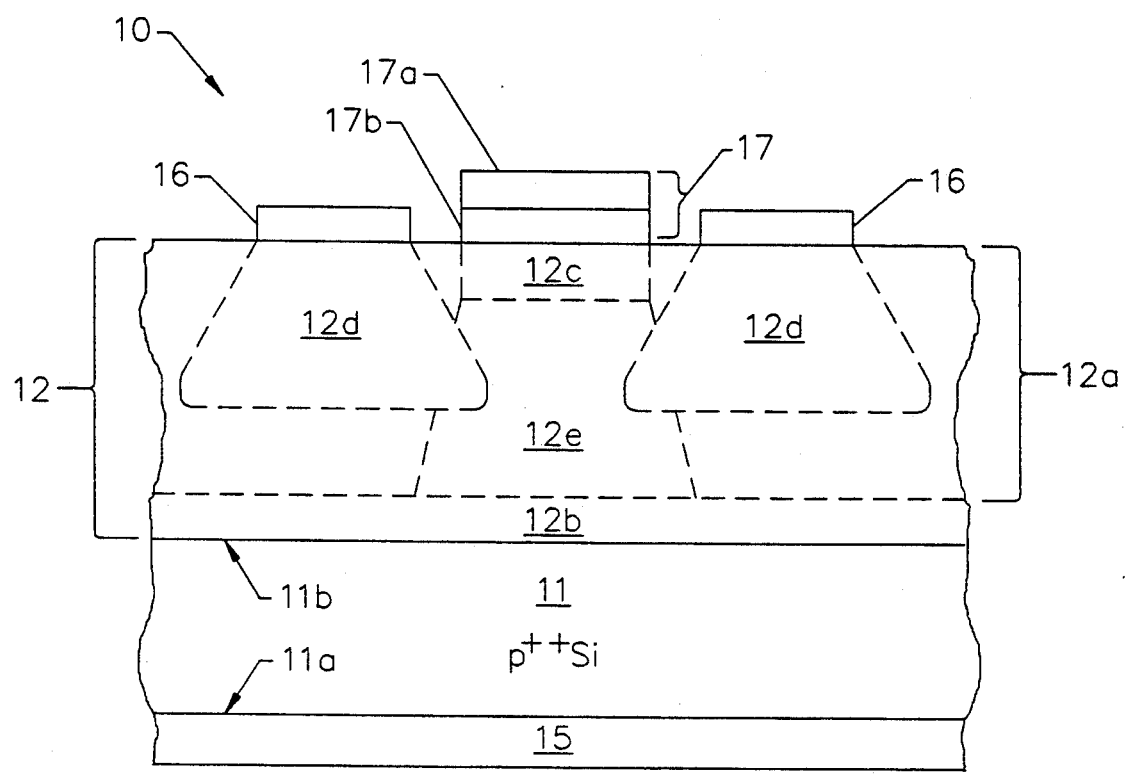
FIG. 1 is a cross-sectional side view of a vertical diamond field effect transistor according to the present invention.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions and positions of grain boundaries are exaggerated for clarity. Like numbers refer to like elements throughout.

Referring now to FIG. 1, a vertical field effect transistor according to the present invention is illustrated. The transistor 10 includes a nondiamond substrate 11, preferably a heavily doped silicon substrate, having a first (bottom) face 11a and a second (top) face 11b. The preferred thickness of silicon substrate 11 is in the range of from about 200 μm to 500 μm. The substrate and may be boron doped at a doping level of $10^{19}$-$10^{20}$ atoms cm$^{-3}$ to provide a p++ substrate. Other dopants, such as those from Group IIIb, may also be used. Other well known dopants may be used to form an n++ substrate such as those elements in Group Va. A diamond layer 12 is formed on the second face 11b of the nondiamond substrate 11. As shown, diamond layer 12 preferably comprises a heavily doped portion 12b, of same conductivity type as substrate 11, adjacent the second face 11b, and a lightly doped or undoped portion 12a on the heavily doped portion 12b. The heavily doped portion 12b is preferably 1-2 μm thick, with the lightly doped portion 12a preferably being 5-10 μm thick. Heavily doped portion 12b is preferably doped with boron at $10^{20}$-$10^{21}$ atoms cm$^{-3}$ to obtain a p++ portion 12b, While lightly doped or undoped portion 12a is preferably doped at $10^{15}$-$10^{18}$ cm$^{-3}$.

Still referring to FIG. 1, source electrode 17 is formed on diamond layer 12. Source electrode 17 preferably comprises a layer 17a of nonrefractory metal such as gold, and an ohmic contact layer 17b of refractory metal such as titanium. A heavily doped contact region 12c of same conductivity type as substrate 11 and portion 12b, may be formed in diamond layer 12 under refractory metal layer 17b, to provide a low resistance ohmic source contact. A gate contact 16 such as a ring or bar contact may also be formed on diamond layer 12 adjacent source contact 17, and a drain contact 15 may be formed on first (bottom) face 11a of nondiamond substrate 11.

When appropriate voltages are applied between source contact 17 and drain contact 15, a vertical channel 12e is formed in diamond layer 12, with carrier movement from source 17 to drain 15 in the direction transverse to faces 11a and 11b of nondiamond substrate 11 and transverse to the opposing faces of diamond layer 12. A Vertical field effect transistor is thereby formed As also shown in FIG. 1, when appropriate gate voltages are applied to gate contact 16, depletion region 12d is formed in diamond layer 12. Depletion region 12d modulates the cross-sectional area of the channel 12e and produces field effect transistor action. It will be understood by those having skill in the art that the source and drain regions can be reversed.

As shown in FIG. 1, diamond layer 12 may be a monocrystalline diamond layer. To facilitate formation of a monocrystalline diamond layer, nondiamond substrate is preferably crystalline silicon carbide, cubic boron nitride, crystalline copper or crystalline nickel. In order to form a monocrystalline diamond layer, substrate 11 preferably has a lattice match with the monocrystalline diamond layer. By lattice matching, the layers are in atomic registry, namely crystal structures are substantially in alignment with each other. Lattice match relates to the difference between the lattice constant ("$a_0$") of diamond and the metal, and is typically expressed in terms of "lattice mismatch". Preferably, the lattice mismatch is less than about 7%, preferably less than about 4%, and more preferably less than about 2% relative to the lattice constant of diamond. The lattice matching results in a strong atomic bonding and an atomically abrupt interface.

Preferably the nondiamond substrate has no stable metal carbides so that carbide formation is avoided at higher temperatures. The nondiamond substrate is preferably nickel, copper, nickel/copper alloy or an alloy of nickel and a metal having minimal stable metal carbides and capable of forming a homogenous alloy with nickel (e.g. gold, palladium, platinum, etc.). These metals and alloys are selected because of their relatively close lattice match with diamond. In particular, the lattice constant of diamond is 3.5668Å, and the lattice constant of nickel is 3.5238Å, resulting in a lattice mismatch of about 1.2%. The lattice constant of copper is 3.6153Å, thereby producing a lattice mismatch with diamond of about 1.4%. When these metals and alloys and other lattice matched conductive metal substrates are used, the substrate inherently includes a drain contact. A separate drain contact on face 11a may not be needed.

As will now be described, the vertical field effect transistor may also be formed using a polycrystalline diamond thin film. The vertical field effect transistor so formed possesses a high voltage and current handling capacity and is less susceptible to grain boundary effects in comparison to comparable lateral (horizontal) channel devices due to the geometry of grain boundary incidence.

Figure 2A:
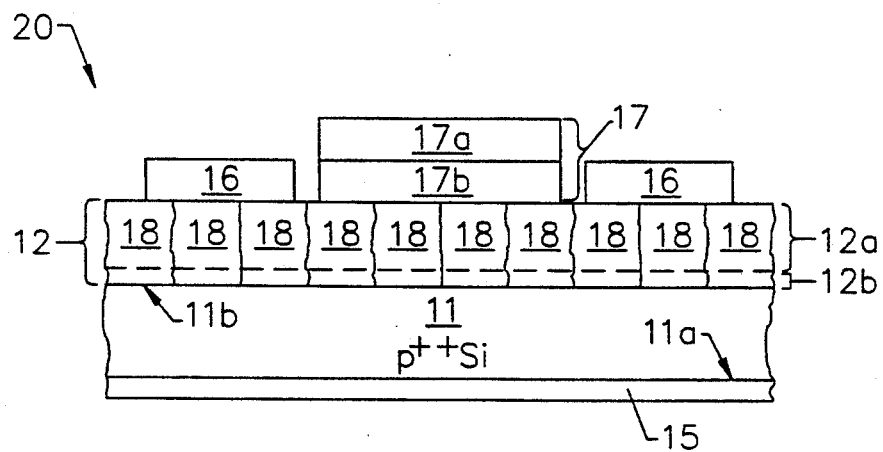
FIGS. 2A and 2B-2C are a cross-sectional side view and top plan views respectively, of another embodiment of a vertical diamond field effect transistor according to the present invention.
Figure 2B:
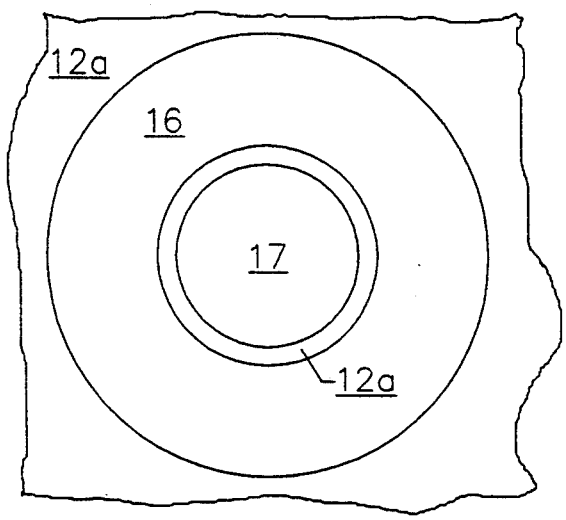
Figure 2C:
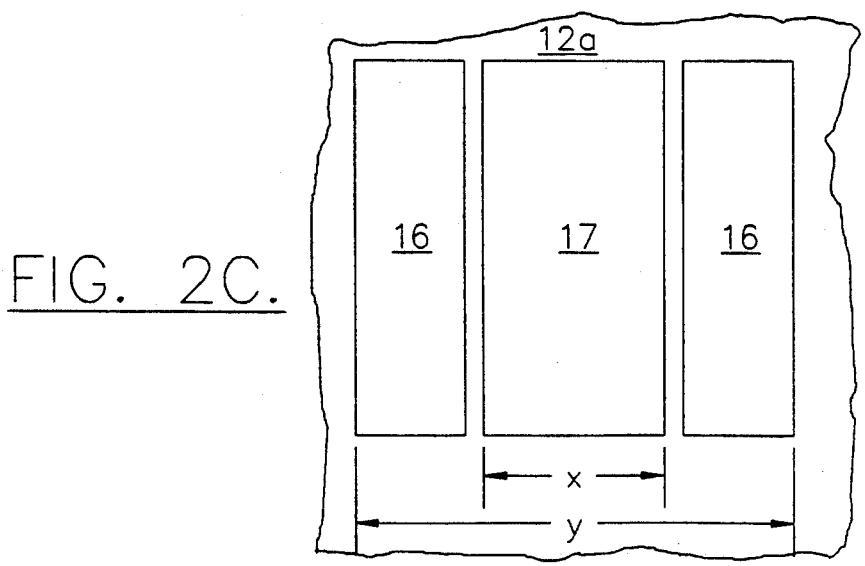

In particular, referring to FIGS. 2A-2C, an embodiment of the present invention fabricated of polycrystalline diamond is shown. As shown in FIG. 2A, vertical field effect transistor 20 includes a single layer of polycrystalline diamond grains 18. As is well known to those having skill in the art, polycrystalline diamond grains of average grain size approaching 15-20 μm may be reliably and repeatedly formed on a heavily doped monocrystalline silicon substrate, as described below. Larger or smaller average grain sizes may also be formed. FIG. 2A illustrates a large device in which the source contact 17 extends across several polycrystalline diamond grains 18 and gate 16 also bridges several polycrystalline diamond grains 18. Since carrier conduction is in the vertical direction transverse to the faces 11a and 11b of substrate 11, minimal carrier movement across grain boundaries occurs and a high performance device is produced.

FIGS. 2B and 2C illustrate alternate plan views of the transistor. As shown in FIG. 2B, source contact 17 may be a circle or polygon, with gate contact 16 being a circular or polygonal ring surrounding source contact 17. As shown in FIG. 2C, source contact 17 may be an elongated contact, with elongated gate contacts 16 on two or more sides of source contact 17 Other configurations will be known to those skilled in the art. These contacts may be patterned using photolithography, E-beam lithography or other well known techniques.

Figure 3A:
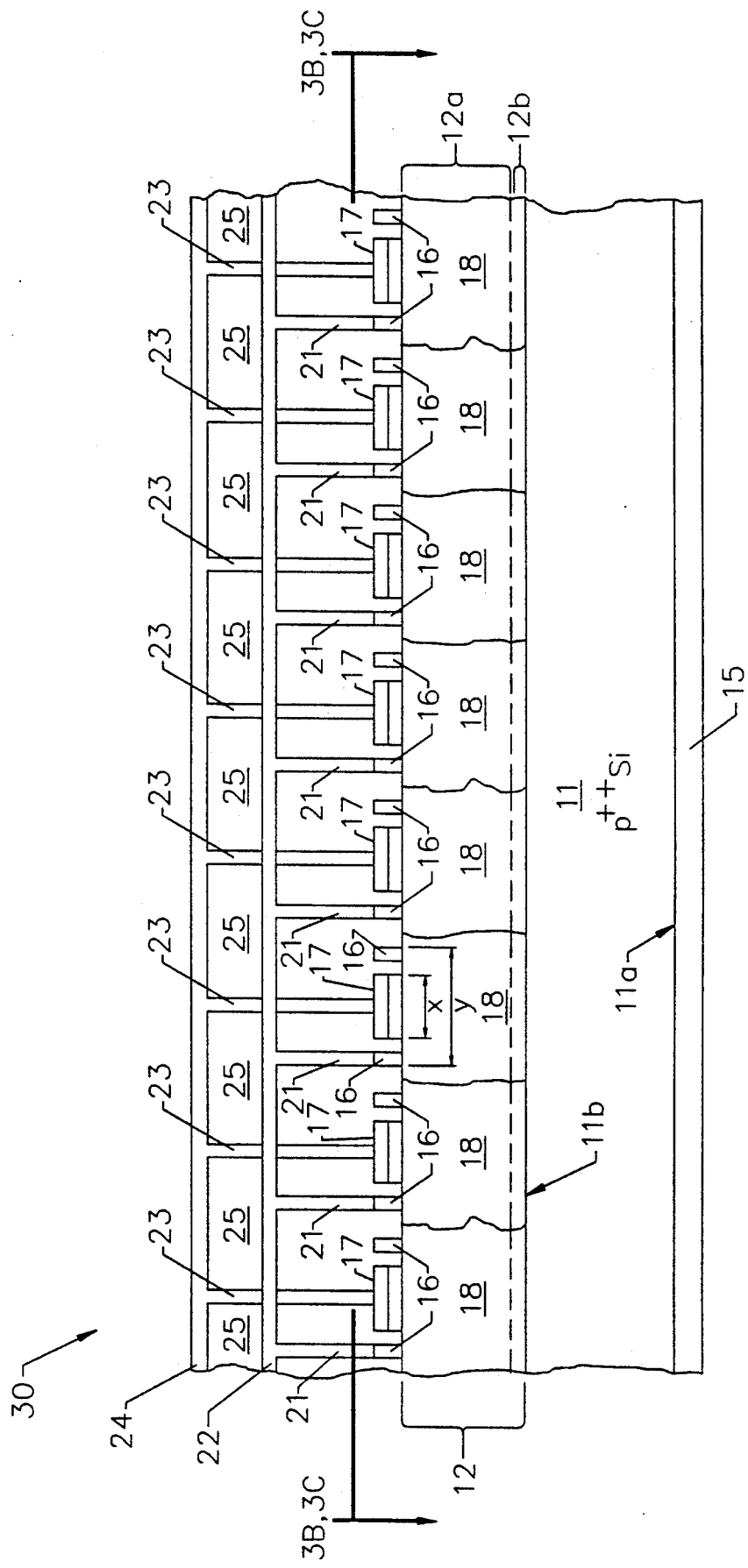
FIGS. 3A and 3B-3C are a cross-sectional side view and top plan views taken along line 3B, 3C of FIG. 3A respectively of yet another embodiment of a vertical diamond field effect transistor according to the present invention.
Figure 3B:
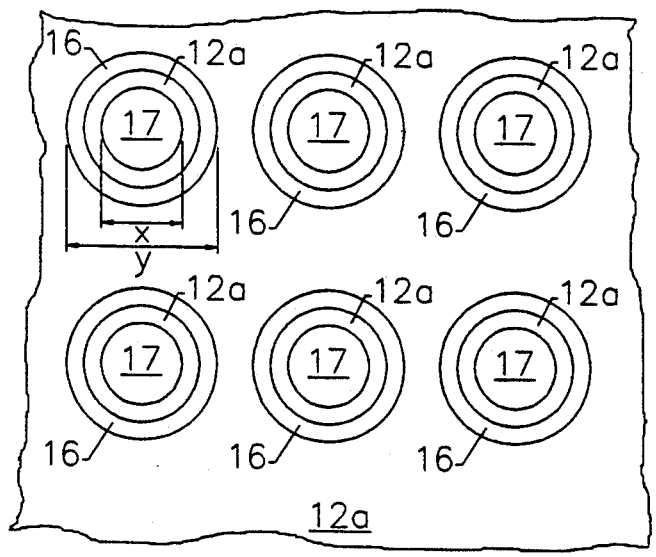
Figure 3C:
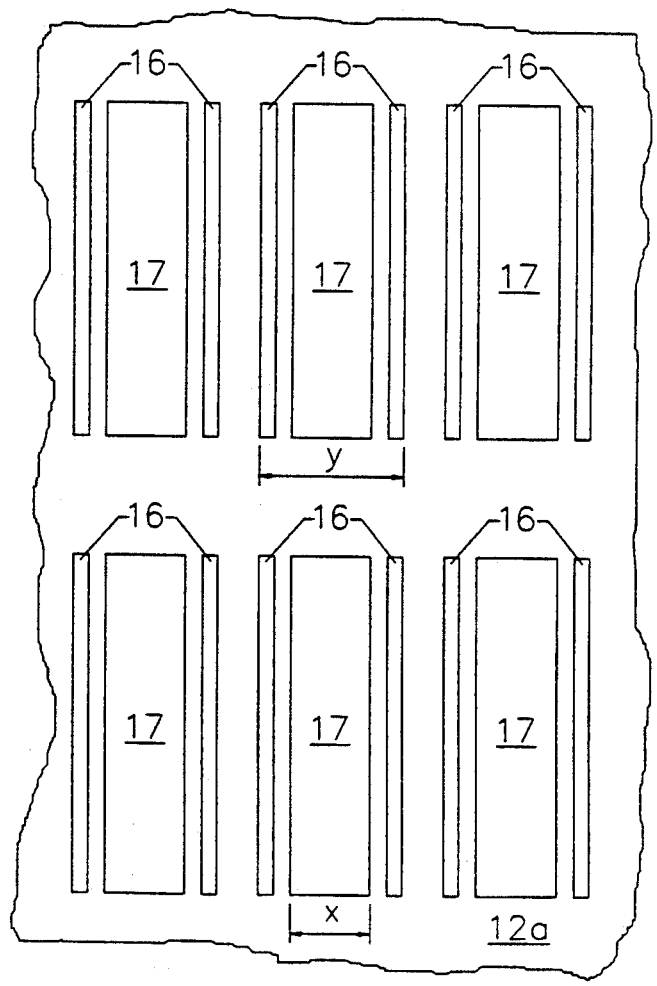

FIGS. 3A-3C illustrate another embodiment of the present invention, in which many small vertical field effect transistors are electrically connected in parallel to form a power device. As shown in FIG. 3A, device 30 includes a plurality of source contacts 17 and gate contacts 16. At least one, preferably many, and most preferably all of the source contacts 17 are narrower than the average polycrystalline diamond grain size; i.e., "x" is less than the average polycrystalline grain size. Preferably, at least one or more, and most preferably all of the gates 16 are narrower than the polycrystalline diamond grain size; i.e., "y" is also less than the average polycrystalline grain size. Accordingly, each transistor preferably operates across at most one grain boundary and, statistically, many of the transistors will be on only one grain and operate across no grain boundaries.

Still referring to FIG. 3A, gate vias 21 may be used to electrically connect some or all of the gates 16 to a gate metallization layer 22, and source vias 23 may be used to connect some or all of the source contacts 17 to source metallization layer 24. Accordingly, a power device, which is capable of handling high voltages and high currents, may be formed using polycrystalline diamond 12, with each individual vertical field effect transistor providing high performance because it bridges no more than one, and preferably no grain boundaries. FIGS. 3B and 3C illustrate top plan views, of an array of circular source and drain contacts, and elongated source and gate contacts, respectively, for alternate embodiments of the invention. It will also be understood by those having skill in the art that the gates need not be electrically connected and the sources need not be electrically connected, to thereby form an array of individual, independent vertical field effect transistors.

Figure 4A:
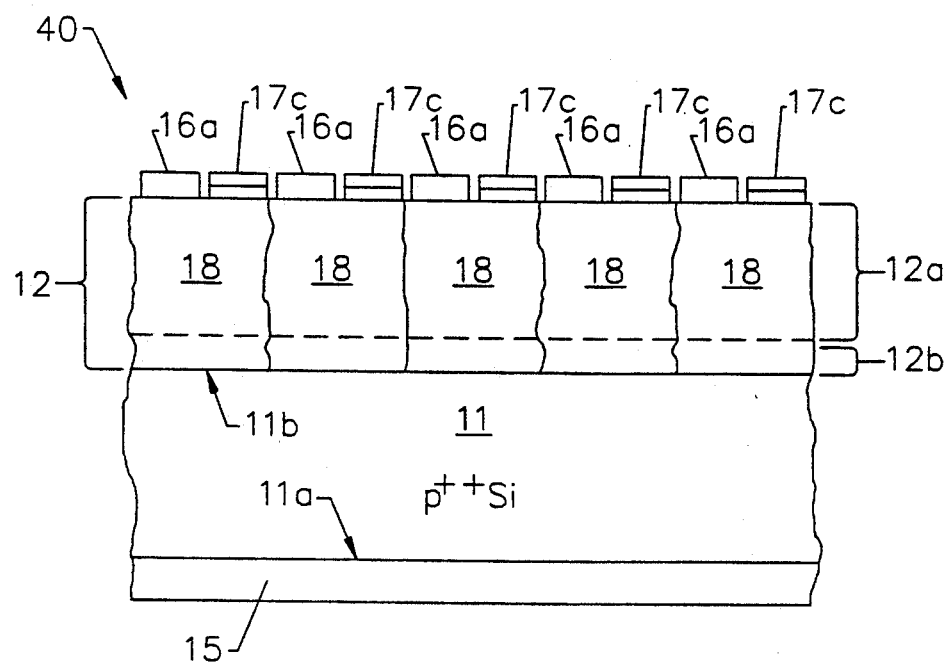
FIG. 4A and 4B are a cross-sectional side view and a top plan view respectively, of still another embodiment of a vertical diamond field effect transistor according to the present invention.
Figure 4B:
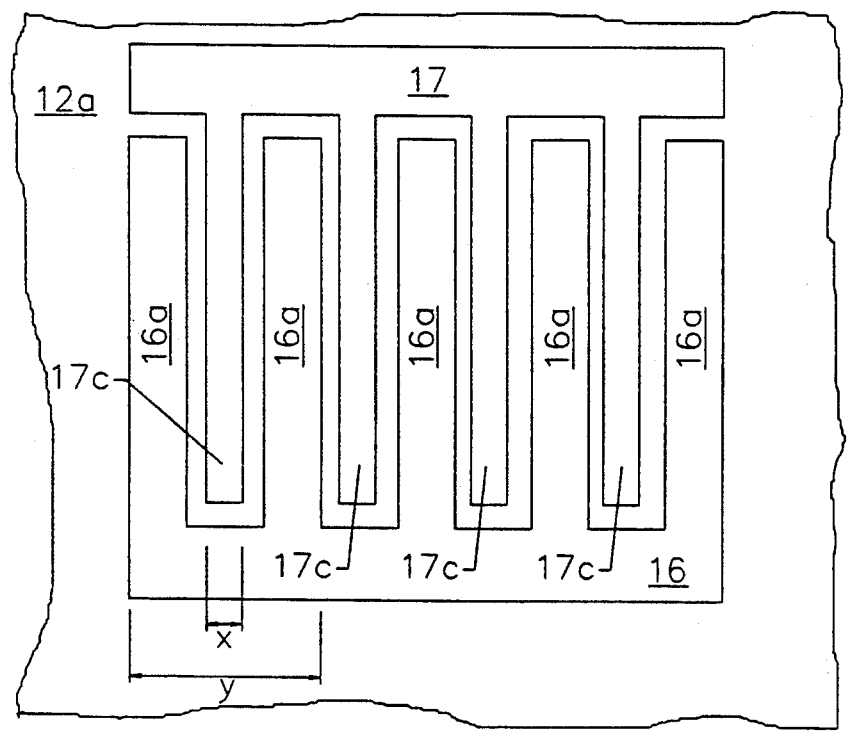

FIGS. 4A-4B illustrate yet another embodiment of the vertical field effect transistor of the present invention. In this embodiment, interdigitated source and gate contacts 17 and 16, respectively, are formed on the polycrystalline diamond layer 12. As shown in FIG. 4B, source contact 17 includes a plurality of fingers 17c and gate contact 16 includes a plurality of fingers 16a. Fingers 17c and 16a alternate across the surface of diamond layer 12. The width "x" of at least one source finger 17c, and preferably of all source fingers 17c, is less than the average grain size. More preferably, the distance "y", spanned by a pair of adjacent gate fingers 16a, and most preferably spanned by all adjacent pairs of gate fingers 16a, is less than the polycrystalline diamond grain size.

Referring now to FIGS. 5A-5H, a process for fabricating a vertical field effect transistor of FIGS. 2A-2C, according to the present invention, will now be described. It will be understood by those having skill in the art that similar techniques can be used to make the field effect transistors illustrated in the remaining figures.

Figure 5A:
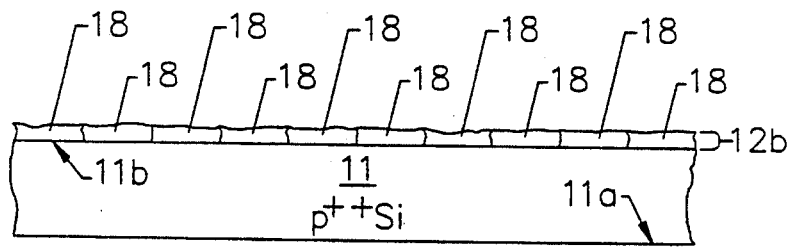
FIGS. 5A-5H are cross-sectional side views of the vertical diamond field effect transistor of FIG. 2A during intermediate processing steps.

Referring now to FIG. 5A, a low resistivity, less than about 0.001Ω-cm monocrystalline silicon wafer, and boron doped at a concentration of $10^{19}$–$10^{20}$ atoms cm$^{-3}$ is used as a substrate. First (bottom) face 11a and second (top) face 11b are preferably polished using well known silicon polishing techniques. Then, polycrystalline diamond grains 18 are grown on top face 11b of substrate 11. Polycrystalline grains of grain size 15-20 μm and dominated by (100) facets, are preferably grown using microwave plasma chemical vapor deposition with the parameters listed in the Table below:

TABLE

| | |
|---|---|
| substrate temperature | 825° C. |
| pressure | 60 torr |
| substrate material (polished with 0.25 μm diamond grit) | silicon |
| total flow rate | 100 sccm |
| hydrogen | 86.8 sccm |
| methane | 10.5 sccm |
| oxygen | 2.7 sccm |
| plasma power | 400-500 W |

These deposition conditions represent about an order of magnitude greater flow rate of methane and oxygen than is conventionally used, and unexpectedly produces large grain polycrystalline diamond grains, dominated by (100) facets.

A problem associated with (100) textured growth is that early stages of the film tend to exhibit large amounts of secondary nucleation. Thus, even though the top surface of the film appears to be free of defects, and transmission electron microscope analysis of individual (100) facets show low defect density material, the bulk of the film can have a very high defect density which can interfere with device performance. In order to produce large polycrystalline diamond grains dominated by (100) facets and exhibiting a (100) texture, a three step growth process may be employed.

In particular, initial growth may be performed using the process conditions shown in the above Table but at a reduced temperature such as 700° C. This initial layer produces minimal secondary nucleation and a latent tendency towards (100) oriented growth. Then, a longer growth period at the process conditions shown in the above Table may be used to encourage the production of (100) faceting. The deposition may then be finished with conditions designed to maximize diamond bonding. These conditions correspond to the conditions described above in Table 1 except that the hydrogen flow rate is 88 sccm, the methane flow rate is 7.5 sccm and the oxygen flow rate is 4.5 sccm. The resulting films exhibit (100) facets although they do not tend to be parallel to the substrate surface, which is the ideal orientation. Accordingly, this process holds considerable promise in the controlled growth of low defect (100) textured diamond films.

Figure 5B:
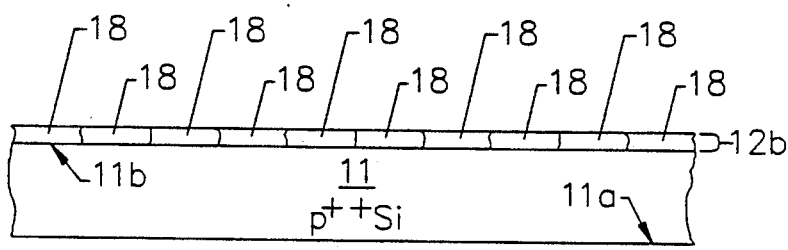

As shown in FIG. 5A, growth may be stopped after 1-2 μm of heavily doped polycrystalline grains 18 have been grown. Then, as shown in FIG. 5B, the surface of polycrystalline grains 18 may be polished to reduce the stress during further deposition of diamond. Polishing of the grains may be accomplished using the technique described in U.S. Pat. No. 4,643,161 to Kim entitled *Method of Machining Hard and Brittle Material*. Other chemical machining techniques may be used to polish the grain surface. It will be understood by those having skill in the art that polishing need not take place at the interface between portions 12b and 12a, but may be performed at other locations during growth of layer 12. It will also be understood by those having skill in the art that the techniques described above may be used to grow polycrystalline grains of 15-20 μm in size without the need for polishing during growth.

Figure 5C:
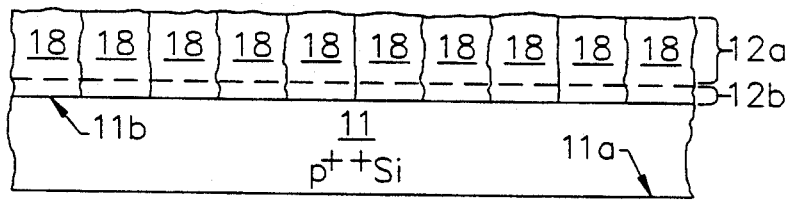
Figure 5D:
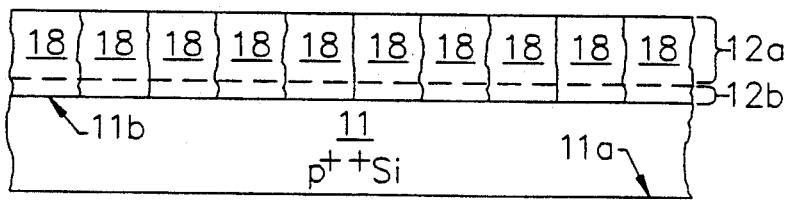

Referring to FIG. 5C, growth of polycrystalline grains 18 is then continued with minimal p doping (less than $10^{18}$ boron atoms $cm^{-3}$) until grains 15-20 μm or more in size have been grown. Then, as shown in FIG. 5D, the top surface is polished to reduce the thickness of layer 12 to between 6-12 μm. Larger grains may also be grown. However, since polycrystalline layer 12 need not be thicker than about 6-12 μm, it may be unnecessary to grow larger grains.

Figure 5E:
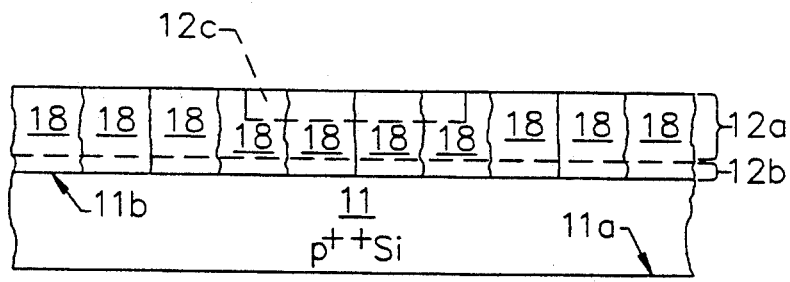

Referring now to FIG. 5E, a low resistance source contact may be provided by implanting a heavily boron doped region 12c in diamond layer 12. A selected area implantation of boron, at a dose on the order of $10^{16}$ and at moderate acceleration may be performed. An anneal is then performed at approximately 1200° C. The graphitized surface layer so formed is removed by etching the substrate in a hot $CrO_3+H_2SO_4$ solution so that a portion of the implanted boron profile is retained in the diamond. This contributes to a surface concentration on the order of $10^{20}-10^{21}$ boron atoms $cm^{-3}$.

Figure 5F:
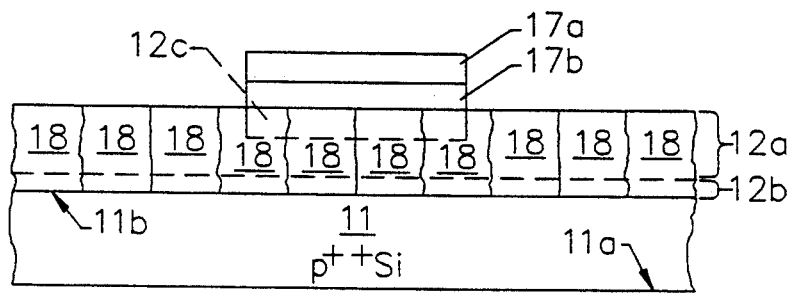

Then, as shown in FIG. 5F, a refractory metal layer 17b, preferably titanium and about 200Å to about 400Å thick, is formed over the boron implanted layer 12c. It will be understood by those having skill in the art that other refractory metals may also be used. A gold passivating layer 17a, preferably about 1000Å to about 1500Å thick, may then be formed on refractory metal layer 17b. Other passivating layers may also be used. Then, an anneal is performed at about 800° C. to about 850° C. for a time period of about 15 minutes to about 90 minutes, to convert at least a portion of the titanium layer 17b to titanium carbide. A low resistance source contact is formed. The process for forming the source electrode 17 as described above is similar to the process for forming ohmic contacts on diamond as described by Moazed et al. in *A Thermally Activated Solid State Reaction Process for Fabricating Ohmic Contacts to Semiconducting Diamond*, Applied Physics Journal, Vol. 68, No. 5, September 1990.

Figure 5G:
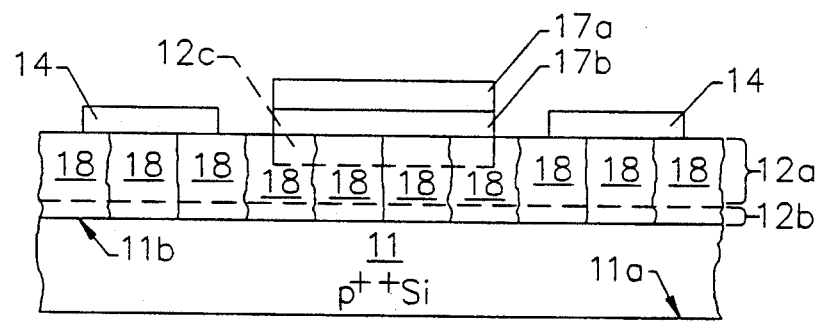

Referring now to FIG. 5G, an optional gate insulating layer 14 may be formed on diamond layer 12. The gate insulating layer is preferably formed of silicon dioxide, and may be deposited onto the diamond layer 12 by conventional techniques, such as chemical vapor deposition or plasma enhanced chemical vapor deposition. Other gate insulating layers include insulating diamond, silicon nitride and/or aluminum oxide. Gate insulating layer 14 may be a thick gate insulating layer, such as 100Å-1000Å and preferably about 600Å thick, or may be a thin gate insulating layer, such less than 20Å thick, to allow tunneling of carriers between the gate electrode and the diamond layer 12. See Venkatesan et al., *Effect of Thin Interfacial SiO₂ Films on Metal Contacts to B Doped Diamond Films*, Journal of the Electrochemical Society, May 1992.

A thick insulating layer provides operation as a well known metal oxide semiconductor field effect transistor (MOSFET), while a thin insulating layer produces operation similar to a metal insulator semiconductor field effect transistor (MISFET). Alternatively, insulating layer 14 may be omitted to provide metal semiconductor field effect transistor (MESFET) operation. See the publication by Shiomi et al. entitled Characterization of *Boron-Doped Diamond Epitaxial Films and Applications for High-Voltage Schottky Diodes and MESFETs*, 1991 MRS Conference Proceedings, pp. 975-980. It will be understood by those having skill in the art that other embodiments of ohmic and rectifying contacts may be formed. Another embodiment of a rectifying contact will be described below in connection with FIG. 7.

Figure 5H:
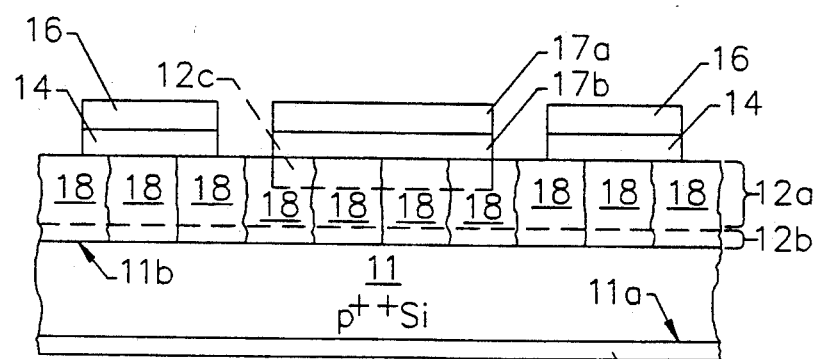

As shown in FIG. 5H, a gate metal conductor layer 16 may then be formed on insulating layer 14 or directly on diamond layer 12. Gate conductor layer may be polycrystalline silicon or gold or other conventional conductor layers. Drain contact 15 is also formed on the bottom face 11a of substrate 11. Drain contact 15 may also be a conventional gold or other conductor layer. A suitable anneal may then be performed.

Figure 6:
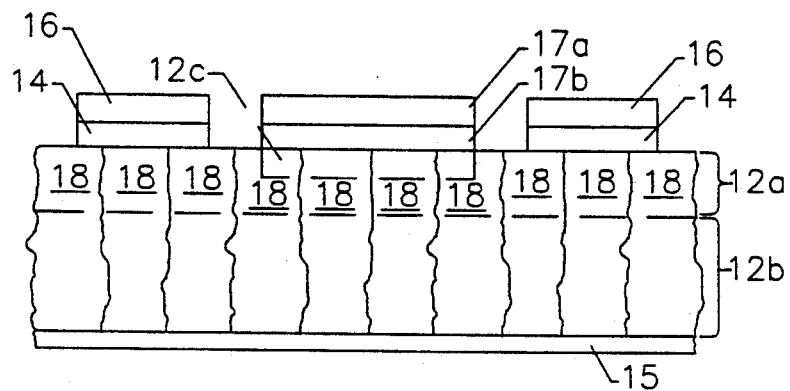
FIG. 6 is a cross-sectional side view of yet another embodiment of a vertical field effect transistor according to the present invention.

FIG. 6 illustrates an alternate operation from that described in FIG. 5H. In FIG. 6, the substrate 11 of FIG. 5G is removed, for example by etching, and drain contact 15 is formed directly on polycrystalline grain layer 12. A vertical field effect transistor, formed in a freestanding polycrystalline grain layer, is thereby provided. It will be understood by those having skill in the art that the polycrystalline grain layer 12 of FIG. 6 is preferably thicker than that described for FIGS. 1-5, in order to provide a self-supporting, freestanding polycrystalline grain layer. Thus, the total thickness of polycrystalline grain layer 12 of FIG. 6 is preferably about 75 μm-100 μm, with layer 12b being about 65 μm-85 μm thick and layer 12a being about 10 μm-15 μm thick.

Figure 7:
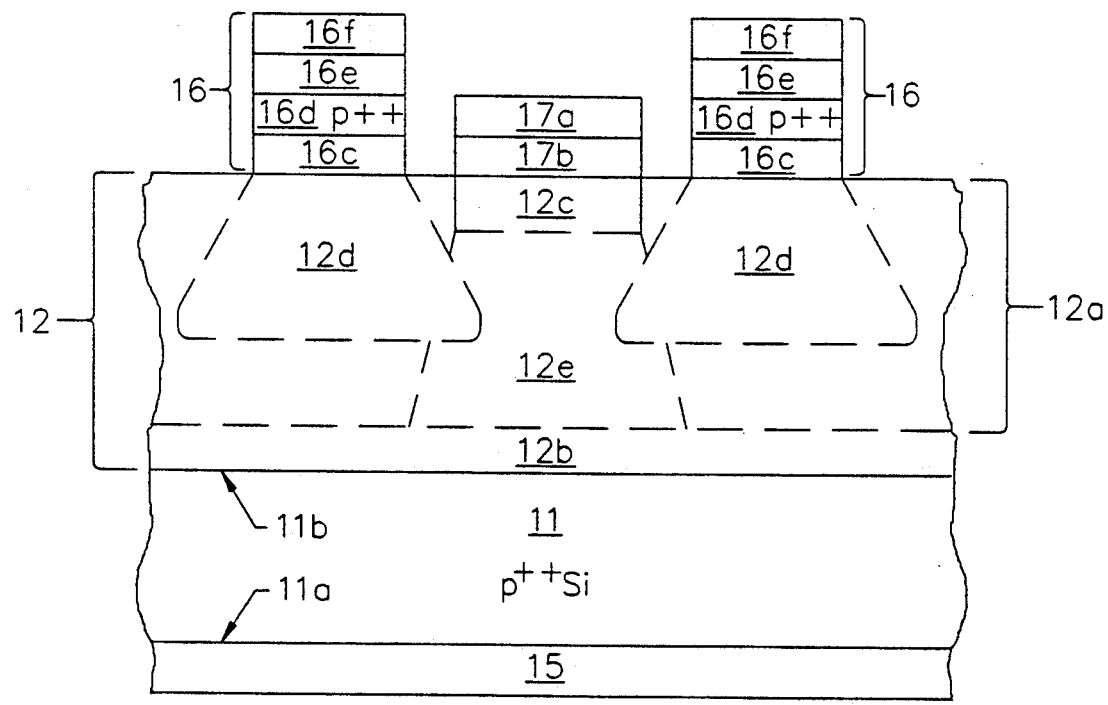
FIG. 7 is a cross-sectional side view of still another embodiment of a vertical field effect transistor according to the present invention.

Referring now to FIG. 7, another embodiment of the vertical diamond field effect transistor of the present invention is described. This embodiment is similar to that already described with regard to FIG. 1, except that an alternative form of rectifying gate contact 16 is included. Heretofore, rectifying contacts to diamond have been formed of nondiamond materials. For example, a rectifying contact on type IIb diamond crystals is formed by depositing films of aluminum, gold, platinum, nickel, n or p type silicon, silicon carbide, transition metal silicides, or carbides on the type IIb diamond crystals. A metal film on an undoped film of diamond which itself is deposited on a film of highly doped diamond also forms a rectifying contact. Finally, a metal film deposited on a thin film of silicon dioxide, about 20Å thick, which itself is formed on a chemically vapor deposited doped diamond film also forms a rectifying contact.

In contrast, as illustrated in FIG. 7, a rectifying contact according to the invention includes a relatively highly doped degenerate layer of diamond 16d on an undoped layer of diamond 16c which is itself formed on a relatively lightly doped layer of diamond 12a. The rectifying contact is thus all-diamond, and does not use nondiamond materials. This rectifying contact is expected to have a high degree of thermal stability and maintain its rectifying properties at high temperatures of up to about 500° C. or more. The p+/undoped/p++ structure of layers 12a, 16c and 16d respectively can thereby provide a transparent rectifying contact that is potentially applicable for optical devices, high power discrete diodes or other applications.

The p++ diamond layer 16d contributes to the "metallic" conductor layer without itself being a metal. It will be understood that one or more layers of metal may be used to establish a bonded ohmic contact to the rectifying contact. In particular, as shown in FIG. 7, a layer of gold 16f on a layer of titanium 16e, similar to already described layers 17a and 17b respectively, may be used to provide a bonded metal contact.

Still referring to FIG. 7, the relatively lightly doped p+ film is provided by doping layer 12a using chemical vapor deposition and in situ doping, or ion implantation, to produce a concentration of about $10^{16}$–$10^{19}$ boron atoms cm$^{-3}$. Alternatively, a lightly doped layer may be formed on the top surface of layer 12a. Film 12a may then be polished using the technique already described. A layer of undoped diamond film 16c, preferably about 20Å–200Å thick, is deposited on selected areas of film 12a. Repolishing may again be performed. Then, relatively heavily doped p++ layer 16d may be deposited as was already described with respect to the formation of heavily doped boron layer 12c in FIG. 5E.

A metal film may then be deposited directly on this implanted surface to form an ohmic contact to the p++ diamond layer 16d for bonding purposes. For increased adhesion, a sputtered metal film may be employed. Alternatively, as shown in FIG. 7, a bilayer metallization of gold 16f and titanium 16e with a subsequent anneal may also be employed, as was already described with respect to the formation of layers 17a-17b.

The rectifying contact so formed may be used in connection with a top or bottom ohmic contact to form a discrete power or high voltage diode, and may be used in all other instances where rectifying contacts are desired. The rectifying contact does not require metal, but rather uses the p++ layer 16d as a degenerative metallic conductor. A transparent rectifying contact may thereby be provided.

Field effect transistor operation is obtained by applying suitable biases to the source, gate and drain electrodes. The field effect transistor so formed is capable of high current and high voltage operation, yet may be fabricated using known techniques. By providing a vertical structure, the effect of grain boundaries is minimized.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A vertical field effect transistor comprising:
   a nondiamond substrate;
   a diamond layer on said nondiamond substrate;
   a drain contact on said nondiamond substrate, opposite said diamond layer;
   a source contact on said diamond layer, said source and drain contacts defining therebetween a vertical channel through said diamond layer; and
   a gate on said diamond layer, adjacent said source contact.

2. The vertical field effect transistor of claim 1 wherein said nondiamond substrate is selected from the group consisting of crystalline silicon carbide, cubic boron nitride, crystalline copper and crystalline nickel.

3. The vertical field effect transistor of claim 1 further comprising a heavily doped region in said diamond layer, adjacent said source contact, for forming an ohmic contact therewith.

4. The vertical field effect transistor of claim 3 wherein said source contact comprises a refractory metal layer on said heavily doped region in said diamond layer, and a nonrefractory metal layer on said refractory metal layer.

5. The vertical field effect transistor of claim 1 wherein said gate comprises a gate insulating layer on said diamond layer and a gate electrode on said gate insulating layer.

6. A vertical field effect transistor comprising:
   a nondiamond substrate;
   a diamond layer on said nondiamond substrate;
   a drain contact on said nondiamond substrate, opposite said diamond layer;
   a source contact on said diamond layer, said source and drain contacts defining therebetween a vertical channel through said diamond layer; and
   a gate on said diamond layer, adjacent said source contact;
   wherein said nondiamond substrate comprises a heavily doped monocrystalline silicon substrate of a predetermined conductivity type.

7. The vertical effect transistor of claim 6 wherein said diamond layer includes a heavily doped portion of said predetermined conductivity type adjacent said nondiamond substrate.

8. The vertical field effect transistor of claim 7 wherein said diamond layer comprises one of an undoped portion and a lightly doped portion of said predetermined conductivity type on said heavily doped portion of said predetermined conductivity type.

9. A vertical field effect transistor comprising:
   a nondiamond substrate;
   a diamond layer on said nondiamond substrate;
   a drain contact on said nondiamond substrate, opposite said diamond layer;
   a source contact on said diamond layer, said source and drain contacts defining therebetween a vertical channel through said diamond layer; and
   a gate on said diamond layer, adjacent said source contact;
   wherein said gate surrounds said source contact on said diamond layer.

10. A vertical field effect transistor comprising:
    a nondiamond substrate;
    a diamond layer on said nondiamond substrate;
    a drain contact on said nondiamond substrate, opposite said diamond layer;
    a source contact on said diamond layer, said source and drain contacts defining therebetween a vertical channel through said diamond layer; and a gate on said diamond layer, adjacent said source contact;

wherein said source contact and said gate are interdigitated on said diamond layer.

11. A vertical field effect transistor comprising:
a single layer of polycrystalline diamond grains, having a pair of opposing faces;
a first source contact on one of the opposing faces of said single layer of polycrystalline diamond grains;
a drain contact on the other of the opposing faces of said single layer of polycrystalline diamond grains opposite said one of the opposing faces, said first source contact and said drain contact defining therebetween a vertical channel through said single layer of polycrystalline diamond grains; and
a first gate on said one of the opposing faces of said single layer of polycrystalline diamond grains, adjacent said source contact.

12. The vertical field effect transistor of claim 11 wherein said first source contact and said drain contact each extend across a plurality of said polycrystalline diamond grains in said single layer of polycrystalline diamond grains.

13. The vertical field effect transistor of claim 11 wherein said first source contact is on only one polycrystalline diamond grain in said single layer of polycrystalline diamond grains.

14. The vertical field effect transistor of claim 11 wherein said polycrystalline diamond grains have a predetermined average grain size, and wherein said source contact is narrower than the predetermined average grain size.

15. The vertical field effect transistor of claim 11 wherein said polycrystalline diamond grains have a predetermined average grain size, and wherein said gate is narrower than the predetermined average grain size.

16. The vertical field effect transistor of claim 11 further comprising:
a second source contact on said one of the opposing faces of said single layer of polycrystalline diamond grains, said second source contact and said drain contact defining therebetween a second vertical channel across said single layer of polycrystalline diamond grains; and
a second gate on said one of the opposing faces of said single layer of polycrystalline diamond grains, adjacent said second source contact;
said polycrystalline diamond grains having a predetermined average grain size, said first source contact and said second source contact being narrower than the predetermined average grain size.

17. The vertical field effect transistor of claim 11 further comprising:
a second source contact on said one of the opposing faces of said single layer of polycrystalline diamond grains, said second source contact and said drain contact defining therebetween a second vertical channel across said single layer of polycrystalline diamond grains; and
a second gate on said one of the opposing faces of said single layer of polycrystalline diamond grains, adjacent said second source contact;
said polycrystalline diamond grains having a predetermined average grain size, said first gate and said second gate being narrower than the predetermined average grain size.

18. The vertical field effect transistor of claim 11 wherein said source contact comprises a plurality of electrically interconnected source fingers on said one of the opposing faces of said single layer of polycrystalline diamond grains, wherein said gate comprises a plurality of electrically interconnected gate fingers of said one of the opposing faces of said single layer of polycrystalline diamond grains and wherein said source fingers and said gate fingers are interdigitated on said one of the opposing faces of said single layer of polycrystalline diamond grains.

19. The vertical field effect transistor of claim 18 wherein said polycrystalline diamond grains have a predetermined average grain size, and wherein one of said source fingers is narrower than the predetermined average grain size.

20. The Vertical field effect transistor of claim 18 wherein said polycrystalline diamond grains have a predetermined average grain size, and wherein each of said source fingers is narrower than the predetermined average grain size.

21. The vertical field effect transistor of claim 18 wherein said polycrystalline diamond grains have a predetermined average grain size, and wherein the distance spanned by one pair of adjacent gate fingers is less than the predetermined average grain size.

22. The vertical field effect transistor of claim 18 wherein said polycrystalline diamond grains have a predetermined average grain size, and wherein the distance spanned by each pair of adjacent gate fingers is less than the predetermined average grain size.

23. A vertical field effect transistor comprising:
a nondiamond substrate having first and second opposing faces;
a single layer of polycrystalline diamond grains on said second face of said nondiamond substrate;
a first source contact on said single layer of polycrystalline diamond grains;
a drain contact on said first face of said nondiamond substrate, said first source contact and said drain contact defining therebetween a vertical channel through said single layer of polycrystalline diamond grains; and
a first gate on said single layer of polycrystalline diamond grains, adjacent said first source contact.

24. The vertical field effect transistor of claim 23 wherein said nondiamond substrate comprises a heavily doped monocrystalline silicon substrate of a predetermined conductivity type.

25. The vertical field effect transistor of claim 24 wherein said single layer of polycrystalline diamond grains includes a heavily doped portion of said predetermined conductivity type adjacent said second face of said nondiamond substrate.

26. The vertical field effect transistor of claim 25 wherein said single layer of polycrystalline diamond grains comprises an undoped or a lightly doped portion of said predetermined conductivity type on said heavily doped portion of said predetermined conductivity type.

27. The vertical field effect transistor of claim 23 wherein said nondiamond substrate is selected from the group consisting of crystalline silicon carbide, cubic boron nitride, crystalline copper and crystalline nickel.

28. The vertical field effect transistor of claim 23 further comprising a heavily doped region in said single layer of polycrystalline diamond grains, adjacent said first source contact, for forming an ohmic contact therewith.

29. The vertical field effect transistor of claim 28 wherein said first source contact comprises a refractory metal layer on said heavily doped region in said single layer of polycrystalline diamond grains, and a nonrefractory metal layer on said refractory metal layer.

30. The vertical field effect transistor of claim 23 wherein said gate comprises a gate insulating layer on said single layer of polycrystalline diamond grains and a gate electrode on said gate insulating layer.

31. The vertical field effect transistor of claim 23 wherein said gate surrounds said first source contact on said single layer of polycrystalline diamond grains.

32. The vertical field effect transistor of claim 23 wherein said first source contact and said gate are interdigitated on said single layer of polycrystalline diamond grains.

33. The vertical field effect transistor of claim 23 wherein said first source contact and said drain contact each extend across a plurality of said polycrystalline diamond grains in said single layer of polycrystalline diamond grains.

34. The vertical field effect transistor of claim 23 wherein said first source contact is on only one polycrystalline diamond grain in said single layer of polycrystalline diamond grains.

35. The vertical field effect transistor of claim 23 wherein said polycrystalline diamond grains have a predetermined average grain size, and wherein said first source contact is narrower than the predetermined average grain size.

36. The vertical field effect transistor of claim 23 wherein said polycrystalline diamond grains have a predetermined average grain size, and wherein said gate is narrower than the predetermined average grain size.

37. The vertical field effect transistor of claim 23 further comprising:
a second source contact on said single layer of polycrystalline diamond grains, said second source contact and said drain contact defining therebetween a second vertical channel across said single layer of polycrystalline diamond grains; and
a second gate on said single layer of polycrystalline diamond grains, adjacent said second source contact;
said polycrystalline diamond grains having a predetermined average grain size, said first source contact and said second source contact being narrower than the predetermined average grain size.

38. The vertical field effect transistor of claim 23 further comprising:
a second source contact on said single layer of polycrystalline diamond grains, said second source contact and said drain contact defining therebetween a second vertical channel across said single layer of polycrystalline diamond grains; and
a second gate on said single layer of polycrystalline diamond grains, adjacent said second source contact;
said polycrystalline diamond grains having a predetermined average grain size, said first gate and said second gate being narrower than the predetermined average grain size.

39. The vertical field effect transistor of claim 23 wherein said first source contact comprises a plurality of electrically interconnected source fingers on said single layer of polycrystalline diamond grains, and wherein said first gate comprises a plurality of electrically interconnected gate fingers on said single layer of polycrystalline diamond grains, with said source fingers and said gate fingers being interdigitated.

40. The vertical field effect transistor of claim 39 wherein said polycrystalline diamond grains have a predetermined average grain size, and wherein one of said source fingers is narrower than the predetermined average grain size.

41. The vertical field effect transistor of claim 39 wherein said polycrystalline diamond grains have a predetermined average grain size, and wherein each of said source fingers is narrower than the predetermined average grain size.

42. The vertical field effect transistor of claim 39 wherein said polycrystalline diamond grains have a predetermined average grain size, and wherein the distance spanned by one pair of adjacent gate fingers is less than the predetermined average grain size.

43. The vertical field effect transistor of claim 39 wherein said polycrystalline diamond grains have a predetermined average grain size, and wherein the distance spanned by each pair of adjacent gate fingers is less than the predetermined average grain size.

* * * * *